United States Patent [19]

Toda et al.

[11] Patent Number: 5,708,618
[45] Date of Patent: Jan. 13, 1998

[54] MULTIPORT FIELD MEMORY

[75] Inventors: Haruki Toda; Nobuo Watanabe, both of Yokohama, Japan

[73] Assignee: Kabushiki Kaisha Toshiba, Tokyo, Japan

[21] Appl. No.: 658,312

[22] Filed: Jun. 5, 1996

Related U.S. Application Data

[63] Continuation of Ser. No. 312,404, Sep. 26, 1994, abandoned.

[30] Foreign Application Priority Data

Sep. 29, 1993 [JP] Japan ................................. 5-243187

[51] Int. Cl.$^6$ ........................................................ G11C 7/00
[52] U.S. Cl. ................................. 365/230.05; 365/189.12; 365/221; 365/230.03
[58] Field of Search ............................... 365/230.05, 221, 365/230.03, 189.12

[56] References Cited

U.S. PATENT DOCUMENTS

| | | | |
|---|---|---|---|
| 4,882,710 | 11/1989 | Hashimoto et al. | 365/189.05 |
| 4,999,814 | 3/1991 | Hashimoto | 365/222 |
| 5,313,431 | 5/1994 | Uruma et al. | 365/230.05 |
| 5,319,603 | 6/1994 | Watanabe et al. | 365/230.05 |
| 5,321,665 | 6/1994 | Balistrers et al. | 365/230.05 |
| 5,374,851 | 12/1994 | Iwase et al. | 365/230.05 |

Primary Examiner—Do Hyun Yoo
Attorney, Agent, or Firm—Loeb & Loeb LLP

[57] ABSTRACT

A multiport field memory includes cell arrays, bit line pairs, gate transmission circuits connecting to the bit line pairs, ports, and a data cross-transmission circuit. The data cross-transmission circuit has first and second transfer gate circuit pairs (each pair connected in series and each pair connected to each bit line pair). The ports, each includes a register for temporarily storing data and for transferring the data from or to the memory cell through the bit line pairs. Each port is connected to each bit line pair through each first and second transfer gate circuit pair. The data cross-transmission control circuit has the first and second transfer gate control circuit pairs to transfer first and second gate drive control signals in order to connect the bit line pair to the registers. The first transfer gate circuit in one pair of the first and second transfer gate circuit pairs is connected to the second transfer gate circuit in the same pair or another pair of the first and second transfer gate circuit pairs in order to transfer the data through a desired port under the control of the cross-transmission control circuit.

8 Claims, 7 Drawing Sheets

MULTIPORT FIELD MEMORY

This is a continuation of application Ser. No. 08/312,404, filed Sep. 26, 1994, now abandoned.

BACKGROUND OF THE INVENTION

1. Field of the Invention

The present invention relates to a multiport field memory for serially transferring data through a plurality of input and output ports.

2. Description of the Prior Art

In a conventional memory such as a field memory capable of serial input and output, one output corresponds to one input, and it is possible to asynchronously delay input data and to output it.

As a specific example of this I/O operation, a FIFO type field memory is known and described in the U.S. patents, for example "FIFO memory including dynamic memory elements, in U.S. Pat. No. 4,882,710" and "Dynamic memory with internal refresh circuit and having virtually refresh-free capability, in U.S. Pat. No. 4,999,814".

However, for example, in the applications of a digital television field and the like wherein various processes are carried out for image data to display the data, up to the present time, it is required to provide a field memory having the capability of a plurality of outputs for one input, not only having the capability of one output for one input.

As can be understood from the foregoing explanation, in a conventional field memory wherein data is received and transferred serially no unit exists with a configuration for handling a plurality of outputs for a plurality of inputs. However, there is a real requirement in the above-mentioned memory for processing various types of image and audio data in various ways.

SUMMARY OF THE INVENTION

Accordingly, an object of the present invention is, with due consideration to the drawbacks of such conventional field memories, to provide a multiport field memory for serially receiving and transferring data through a plurality of input and output ports.

In accordance with one aspect of the present invention, there is provided a multiport field memory comprising:

a plurality of cell arrays consisting of a plurality of memory cells arranged in rows and columns;

a plurality of bit line pairs through which data is transferred from and to said memory cells;

gate transmission means connecting to the bit line pairs, comprising: a plurality of first and second transfer gate circuit pairs, each first and second transfer gate circuit pair being connected in series, each first and second transfer gate circuit pair being connected to each bit line pair;

a plurality of ports, each port comprising register means, for storing temporarily said data and for transferring said data from or to said memory cell through said bit line pairs, each port being connected to each bit line pair through each first and second transfer gate circuit pair; and data cross-transmission control means comprising:

first gate control means for transferring a first gate drive control signal to each first transfer gate circuit in order to connect said bit line pair to said register means in each port; and second gate control means for transferring a second gate drive control signal to each second transfer gate circuit in order to connect said bit line pair to said register means in each port, wherein under said cross-transmission means said first transfer gate circuit in one pair of said first and second transfer gate circuit pairs is connected to said second transfer gate circuit in the same pair or another pair of said first and second gate transfer circuit pairs in order to transfer said data to desired port.

The multiport field memory described above, further comprises:

a plurality of cell array groups divided by grouping said cell arrays;

a write-in register consisting of a plurality of registers grouped into a plurality of the ports corresponding to the respective cell array groups, for storing data transferred independently, asynchronously, and serially for said cell array group, and for transferring said data at a time into cell group forming each row of said cell arrays; and a read-out register consisting of a plurality of registers grouped into a plurality of ports corresponding to the respective cell array groups, for storing data transferred at a time from said cell group forming each row of said cell arrays, and for transferring said data independently, asynchronously, and serially per said cell array group, wherein said data cross-transmission means is incorporated between said write-in register and said cell arrays, and between said cell arrays and said read-out register, and data is transferred among said write-in register and said cell array groups, and among said cell array groups and said read-out register.

In the multiport field memory described above, write-in transfer and read-out transfer are performed for one memory cell through a first write-in register in said write-in register and a first read-out register in said read-out register, and then write-in transfer and read-out transfer are performed for the same memory cell through a second write-in register in said write-in register and a second read-out register in said read-out register.

The multiport field memory described above, further comprises:

a plurality of cell arrays divided into a plurality of cell array groups;

a write-in register consisting of a plurality of registers grouped into a plurality of ports corresponding to said respective cell array groups, for sequentially storing data which is transferred serially, for transferring said data at a time into said cell array group forming a row of said sell array; and a read-out register consisting of a plurality of registers grouped into a plurality of ports corresponding to said respective cell array groups, for storing said data transferred at a time from said cell array group forming said row of said cell array, and for transferring this stored data per said cell array group independently, asynchronously, and serially, wherein said data cross-transmission means, incorporated between said read-out register and said cell arrays, cross-transmits data between said read-out registers of optional port and optional cell array group.

In the multiport field memory described above, said registers in said read-out register corresponding to each cell array group store the same data in said same memory cell in said cell array independently, asynchronously, and serially.

The multiport field memory described above, further comprises:

a plurality of cell arrays divided into a plurality of cell array groups;

a write-in register for transferring stored data at a time into said cell array group forming a row of said cell array;

a read-out register consisting of a plurality of registers grouped into a plurality of ports corresponding to said respective cell array groups, for storing data serially, for storing said data transferred at a time from said cell array group forming said row of said cell array, and for transferring this stored data per said cell array group independently, asynchronously, and serially, wherein said data cross-transmission means, incorporated between said read-out register and said cell arrays, cross-transmits data between said read-out registers of optional port and optional cell array group.

The multiport field memory described above, further comprises:

a plurality of cell arrays divided into a plurality of cell array groups;

a write-in register consisting of a plurality of registers grouped into a plurality of ports corresponding to said respective cell array groups, for storing data which is transferred independently, asynchronously, and serially per said cell array group, for transferring said data at a time into said cell array group forming a row of said sell array; and a read-out register for storing data transferred at a time from said cell array group forming a row of said cell array, and for transferring this stored data serially, wherein said data cross-transmission means, incorporated between said write-in register and said cell arrays, cross-transmits data between said write-in registers of optional port and optional cell array group.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Figure 1:
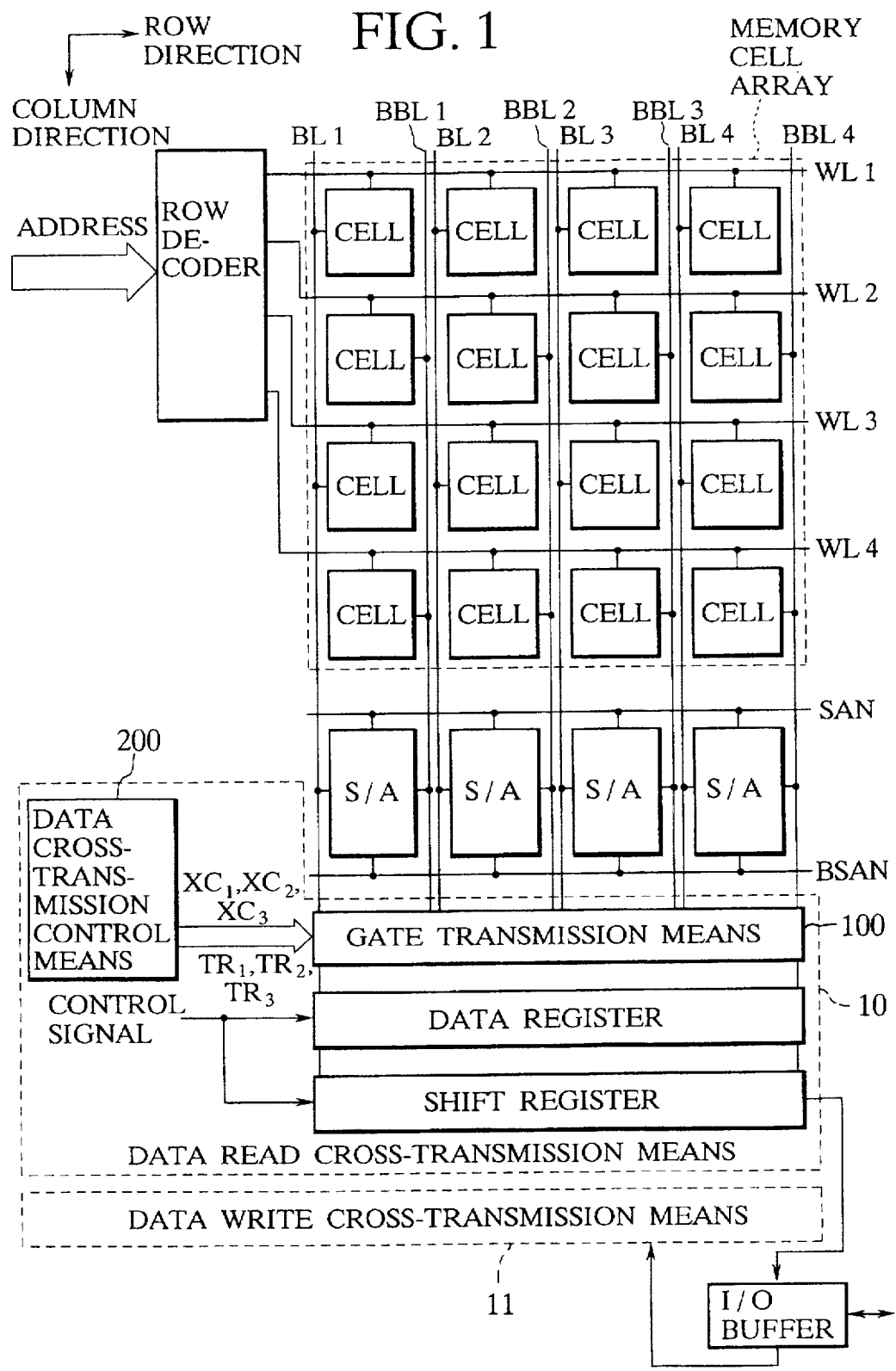
FIG. 1 is a block diagram of a multiport field memory including a data transmission means as a preferred embodiment of the present invention.

FIG. 1 is a block diagram of a multiport field memory including a gate transmission means 100 and a data cross-transmission control means 200 as a preferred embodiment of the present invention. In FIG. 1, memory cell array includes sixteen memory cells connecting four bit line pairs (BL1 and BBL1, BL2 and BBL2, BL3 and BBL3, and BL4 and BBL4). The memory cell array is connected to data register through a gate transmission means 100 which is one of the important main parts of this embodiment of the present invention. The data cross-transmission control means 200 which is also one of the important main parts of the present invention controls the operation of the gate transmission means 100. The reference number 10 designates a data read cross-transmission means for data read operation by which the cross-transmission data read operation is performed, and the reference number 11 denotes a data write cross-transmission means for data write operation by which the cross-transmission data write operation is performed. The configuration of the data write cross-transmission means 11 is basically same as that of the data read cross-transmission means 10. Therefore a detailed configuration of the data write cross-transmission means 11 is omitted from FIG. 1. The read operation and/or the write operation are performed through the respective means 10 and 11 shown in FIG. 1.

Figure 2:
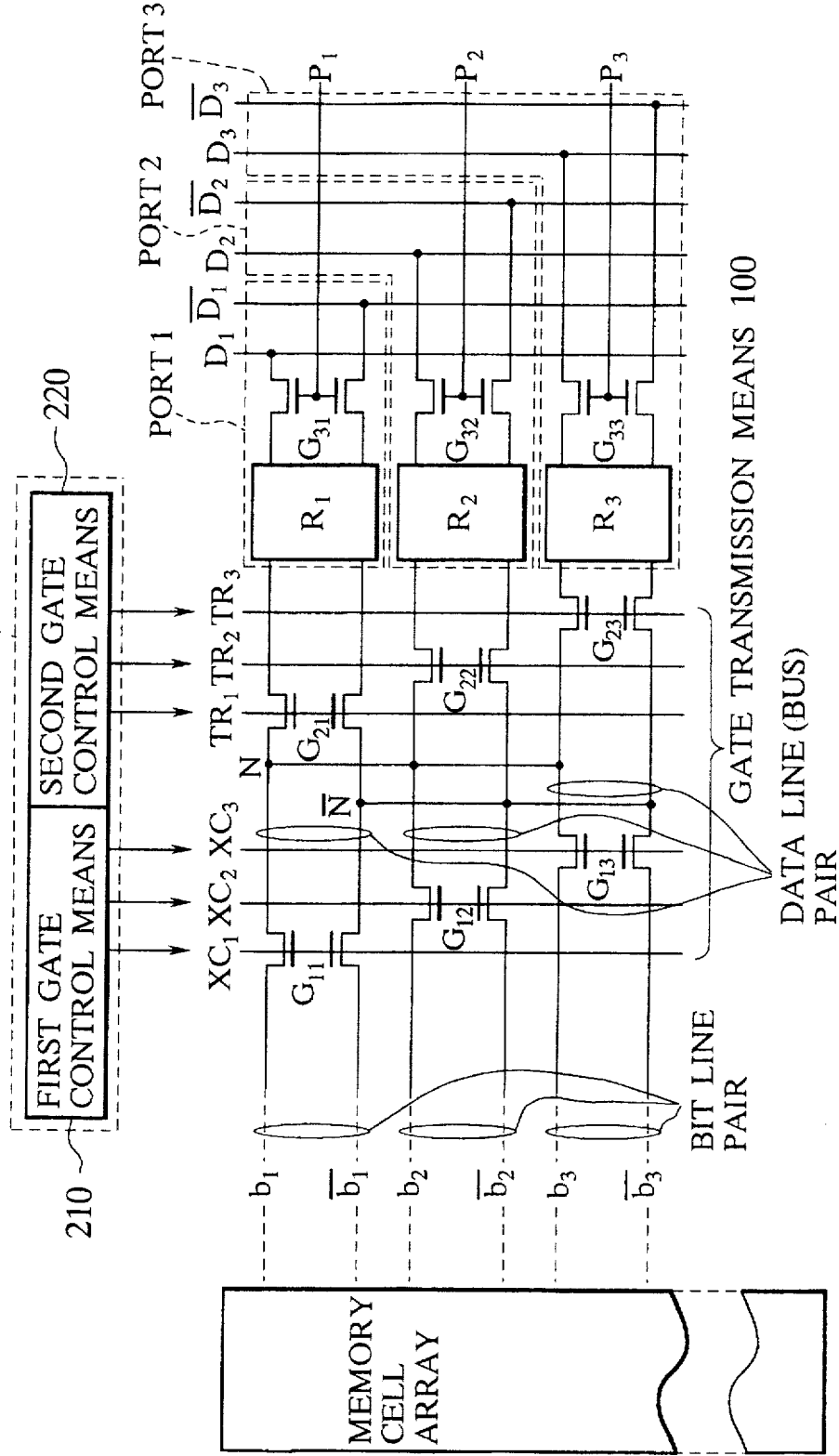
FIG. 2 is a block diagram mainly showing a gate transmission means incorporated in the multiport field memory shown in FIG. 1.

FIG. 2 is a block diagram mainly showing the gate transmission means 100 including transfer gate circuits G11, G12, G13, G21, G22, and G23 and the data cross-transmission control means 200 incorporated in the multiport field memory shown in FIG. 1.

In FIG. 2, the number of the bit line pairs are three for more brief explanation of the present invention. This diagram shows the transfer gate circuit G11, G12, G13, G21, G22, and G23 configuration for asynchronously transferring data from one memory cell to a plurality of data buses, which is an important circuit configuration focusing on the provision of multiport serial access.

The data cross-transmission control means 200 includes a first gate control means 210 and a second gate control means 220 for controlling the operation of the first transfer gates G11, G12, and G13, and the second transfer gates G21, G22, and G23 by first and second gate drive control signals, respectively.

FIG. 2 shows the case where one cell can be accessed through three access paths. Also, this diagram illustrates the minimum unit, and a plurality of the minimum units are formed in the multiport field memory. The bit line pairs are (b1, /b1), (b2, /b2), and (b3, /b3) shown in FIG. 2.

The data stored in a memory cell is transferred through the bit line pair and sensed two items of the sensed data on the bit line pair to set them as complementary signals to each other. The reference characters XC1, XC2, XC3 are transfer gate drive signals (first gate drive control signals) for selecting the data to be transferred and the bit line pair through which this data is to be transferred, via the transfer gates G11, G12, G13.

The reference characters TR1, TR2, TR3 are transfer gate drive signals (second gate drive control signals) for determining the data to be transferred and the register through which this data is to be transferred, via the transfer gates G21, G22, G23.

Data line nodes N, /N, incorporated between these two transfer gates G11, G12, and G13, and G21, G22, and G23, are connected to all of data line pairs which form the access paths.

Each of R1, R2, and R3 is a register for forming each port to serially transfer data through the respective access path.

P1, P2, P3 are selection signals for serially accessing the registers at each port through the gates G31, G32, and G33. Data stored in the register selected by the selection signal P1 to P3 is transferred through data line pair D1 and D1 in the port 1, through data line pair D2 and /D2 in the port 2, and through data line pair D3 and /D3 in the port 3.

Gate transmission means 100 of one of the main components of the present invention comprises the transfer gates G11, G12, G13, G21, G22, G23, connected to the ports port1, port2, and port3.

Here, considering the case of data read-out under the gate transmission means 100, we will examine the port 1, specifically, the case of read-out from the register R1.

First, the signals TR1 and XC1 are switched from low to high to read out data from the bit line pair b1, /b1. The signals TR1 and XC2 are switched from low to high to read out data from the bit line pair b2 and /b2. The signals TR1 and XC3 are switched from low to high to read out data from the bit line pair b3 and /b3.

In the case where data is transferred through the port 2 or the port 3, the signals TR2 or TR3 may be switched from low to high instead of the signal TR1. In this manner, it is possible to read out data for the same bit line pair from any port.

Figure 3:
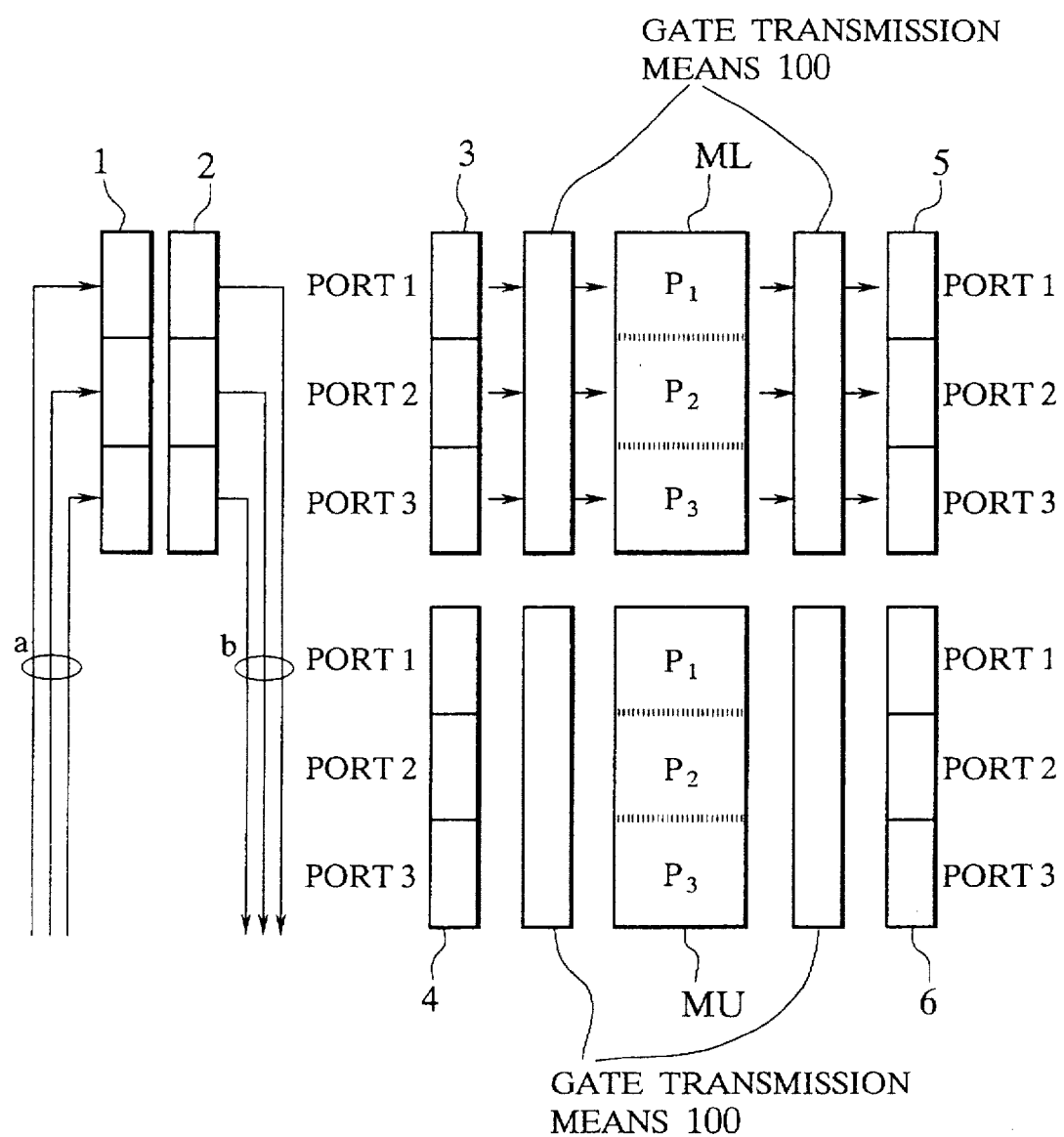
FIG. 3 is a diagram showing a multiport field memory including the gate transmission means shown in FIG. 1 between memory cells.

One architectural configuration of a FIFO type serial memory system with this type of data transmission system is shown in FIG. 3.

In FIG. 3, the construction elements of the FIFO type serial memory system are line memories 1, 2, write-in registers 3, 4, read-out registers 5, 6, and memory cell arrays MU, ML. The gate transmission means 100 are incorporated between write-in registers 3, 4 and the memory cell arrays MU, ML, and between the memory cell arrays MU, ML and the read-out registers 5, 6.

These line memories 1, 2, write-in registers 3, 4, and read-out registers 5, 6 are respectively made up of three parts for three ports 1, 2, and 3. With the exception of the line memories 1, 2, these are broadly divided into two parts, a lower order group and an upper order group. Lower order and upper order refers to lower order and upper order addressing during serial access.

Next, an outline of a FIFO operation using the system described above will be explained.

First, during the operation of writing in data, data is transferred serially to the line memories 1, 2 to store it, followed by serial input to the write-in registers 3, 4, alternately.

In the memory cell arrays ML and MU, data stored in the write-in register 3 is transferred to the lower order memory cell array ML during serial input to the write-in register 4, then, data from the write-in register 4 is transferred to the upper order memory cell array MU at a time during serial input to the write-in register 3.

In the data read-out operation, data is first read out from the line memories 1, 2. During this period, data from the lower order memory cell array ML is transferred to the read-out register 5 at a time, and data is read out serially from the read-out register 5 following the line memories 1, 2 continuously. In addition, during this period, the data read out from the memory cell array MU is transferred at once to the read-out register 6, and the data from the read-out register 6 is continuously read out, serially, following the read-out register 5.

Subsequently, data is read out alternately from the read-out registers 5, 6 in the same manner.

In FIG. 3, the reference character "a" indicates the state of serial input of input data from external sections, and this case shows independent write-in to the three ports of the line memory 1. The reference character "b" indicates the state of serial output of output data, and this case shows independent read-out from the three ports of the line memory 2.

The read-out and write-in and the input and output to all three ports can be carried out independently and asynchronously.

The system shown in FIG. 3 comprises three independent systems which are arranged in parallel. In this configuration, it is possible to have the field memory handle various types of data processing by setting the relationship between the ports.

First, the case is considered for a configuration in which cross-transmission is possible for both the write-in and the read-out registers, as shown in FIG. 2. In this case, the memory capacity in the memory cell array is apparently increased for each port by the use of time sharing for these ports, and can be tripled, as in this example.

Figure 4:
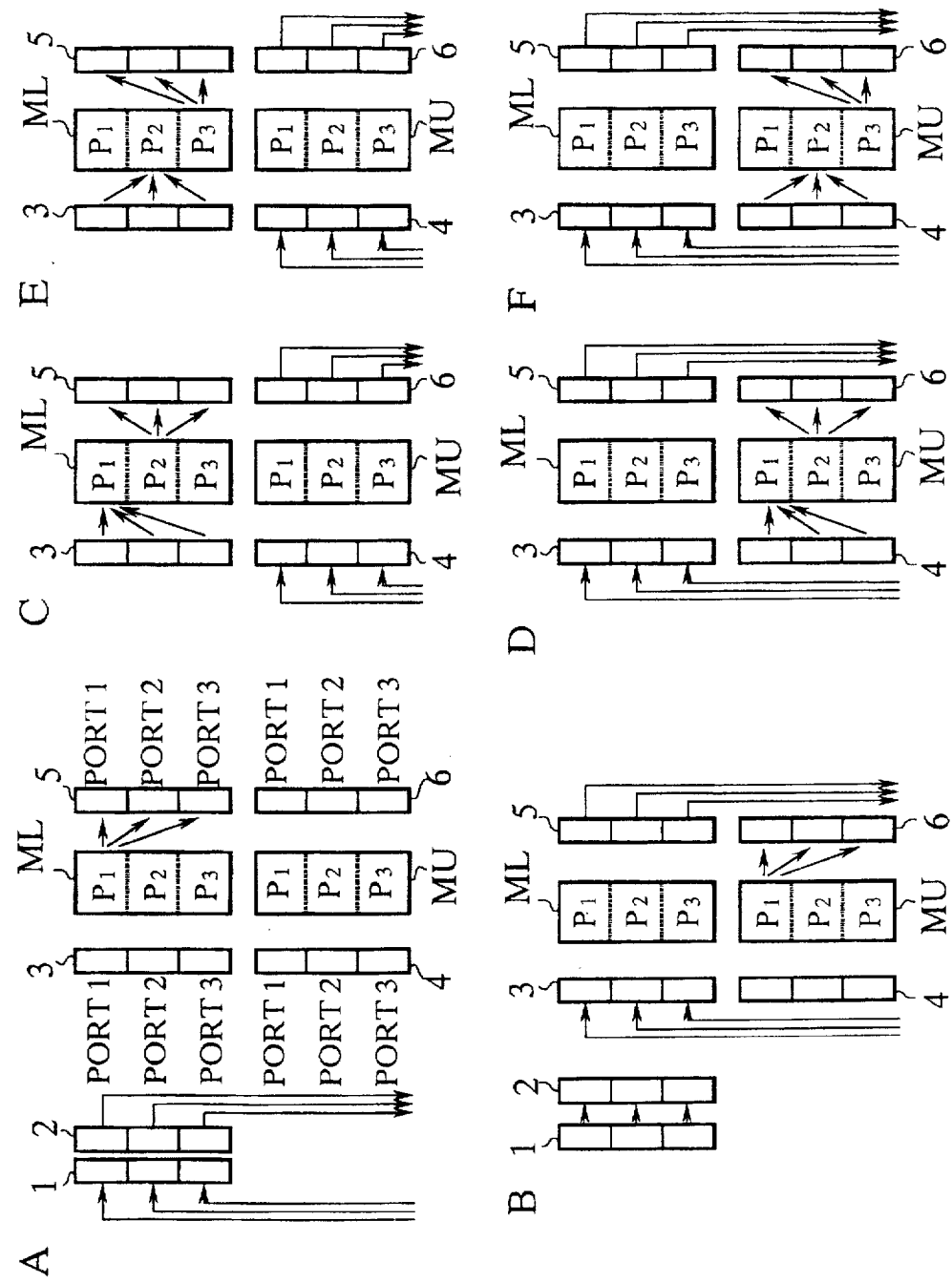
FIG. 4 is a diagram showing a sequence of operation in the case of cross-transmission for both write-in and mad-out in the multiport field memory shown in FIG. 3 (the gate transmission means are omitted).

FIG. 4 shows the sequence of the data transmission at this time. Serial access proceeds in the sequence A, B, C, D, E, and F, and the various steps show the conditions of serial access in the line memory and register, respectively. The gate transmission means 100 are omitted from FIG. 4.

In addition, the write-in and read-out are illustrated as proceeding simultaneously, but actually these are carried out independently and asynchronously.

This is also the same for each of the ports. Further, the line memories 1, 2 are omitted, with the exception of A and B. Below, these am explained in sequence.

First, as shown in A of FIG. 4, when the line memories 1 and 2 are serially accessed, for both write-in and read-out, the parts corresponding to each port are accessed asynchronously, in parallel. For read-out, the data for the same part of the lower order cell array ML is transferred to each port of the read-out register 5, and preparation for the next read-out step is carried out. These data of the same part can be transferred to a read-out register for a different port because of the configuration of the transmission gate shown in FIG. 2.

Next, as shown in B of FIG. 4, when the registers 3, 5 of the lower order address are accessed, the parts corresponding to each port are accessed asynchronously, in parallel, for both write-in and read-out. The write-in is shifted to the write-in register 3, and when the read-out is entered at this step, the data is transferred at a time to each port from the write-in side line memory 1 to the mad-out side line memory 2.

For read-out, the data for the first part of the upper order cell array MU is transferred to each port of the read-out register 6, and preparation for the next read-out step is carried out.

Next, as shown in C of FIG. 4, when the registers 4, 6 of the upper order address are accessed, the parts corresponding to each port are accessed asynchronously, in parallel, for both write-in and read-out. For write-in, the various pieces of data from each port of the write-in register 3 to the first part of the lower order cell array ML, and this data is stored in the memory cell.

For read-out, the data for the second part of the lower order cell array ML is transferred to each port of the read-out register 5, and preparation for the next read-out step is carried out.

Next, as shown in D of FIG. 4, when the registers 3, 5 of the lower order address is accessed, the parts corresponding to each port are accessed asynchronously, in parallel, for both write-in and read-out.

For write-in, the various pieces of data from each port of the write-in register 4 are transferred to the first part of the upper order cell array MU, and this data is stored in the memory cell.

For read-out, the data for the second part of the upper order cell array MU is transferred to each port of the read-out register 6, and preparation for the next read-out step is carried out.

Next, as shown in E of FIG. 4, when the registers 4, 6 of the upper order address are accessed, the parts corresponding to each port are accessed asynchronously, in parallel, for both write-in and read-out.

For write-in, the various pieces of data from each port of the write-in register 3 are transferred to the second part of the lower order cell array ML, and this data is stored in the memory cell.

For read-out, the data for the third part of the lower order cell array ML is transferred to each port of the read-out register 5, and preparation for the next read-out step is carried out.

Next, as shown in F of FIG. 4, when the registers 3, 5 of the lower order address are accessed, the parts corresponding to each port are accessed asynchronously, in parallel, for both write-in and read-out. For write-in, the various pieces of data from each port of the write-in register 4 is transferred to the second part of the upper order cell array MU, and this data is stored in the memory cell.

For read-out, the data for the third part of the upper order cell array MU is transferred to each port of the read-out register 6, and preparation for the next read-out step is carried out.

Thereafter, access and data transmission proceeds in the same manner.

Figure 5:
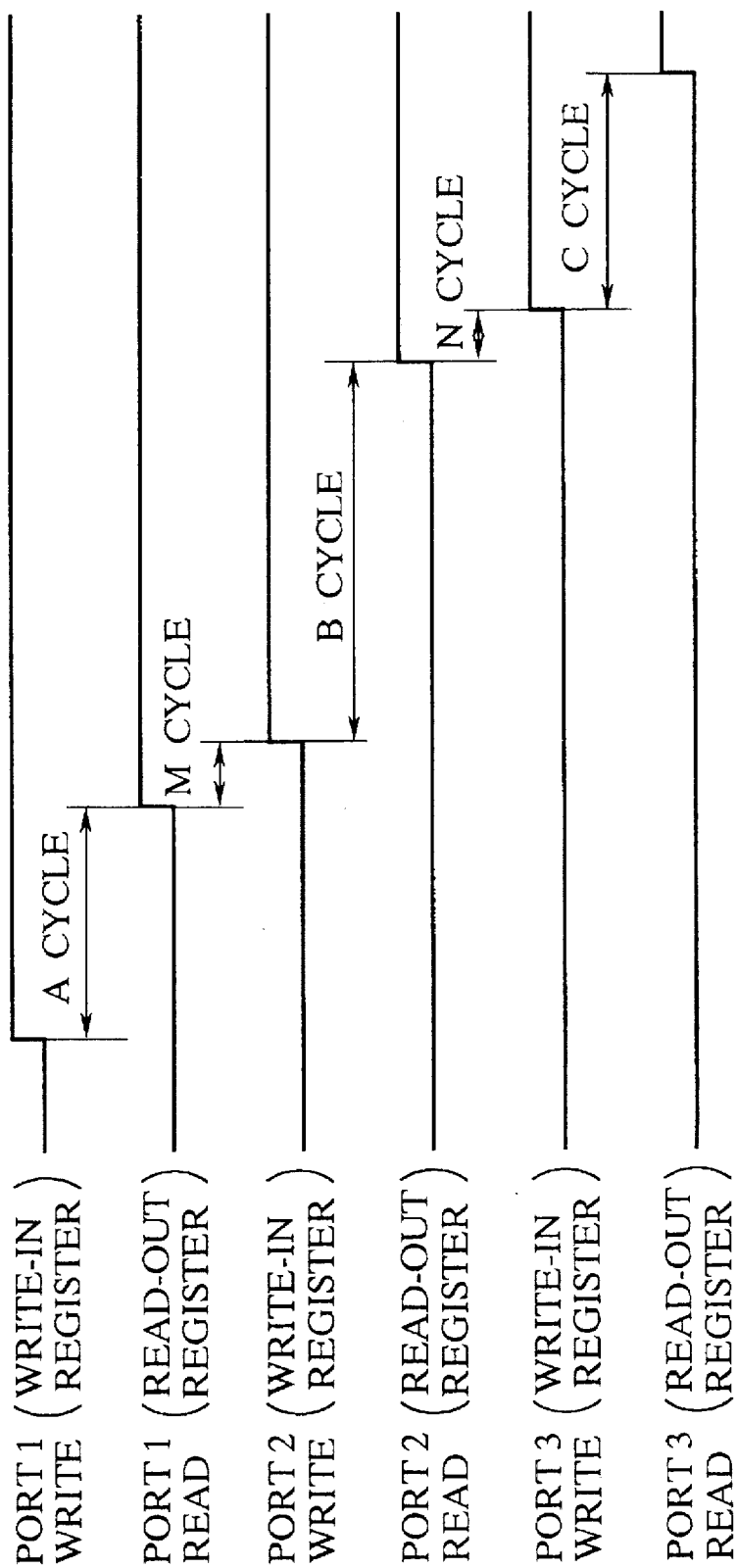
FIG. 5 is a timing chart showing a time sharing in the sequence of the cross-transmission operation shown in FIG. 4.

With the multiport field memory system explained above, in the case where the written-in data is read out after a specified delay, compared to the case where there is no cross-transmission to the memory cell array, three times the capacity can be used. FIG. 5 shows a timing chart for the time-sharing of this case.

In FIG. 5, it is possible to read out the data transferred from the port 1 of the write-in register, separately in time from a cycle wherein there are more bits than the number of the bits forming the line memory, for example, the A cycle.

When reading out the data from the memory cell, the data in the memory cell becomes useless and other data can be stored to the memory cell. Accordingly, after M cycles from the initial read-out cycle from the port 1 of the read-out register, the data from the port 2 of the write-in register is written in, and overwritten onto the memory cell which has been read out from the port 1 of the read-out register, so that the data in the memory cell is renewed.

The data written-in to the port 2 of the write-in register is read out separately in time from a cycle wherein there are more bits than the number of the bits forming the line memory, for example, the B cycle.

After this read out, N cycles occurring in the same manner are written in from the port 3 of the write-in register, and then read out separately from the C cycle to use the memory cell in triplicate by time sharing.

The fact that is not necessary that the input port and the output port correspond but can be used matched with an optional pair, can be clearly understood from the above explanation.

With the above-mentioned system, the same data can be simultaneously written into three ports. The serially written-in data, then, may have three different delays and can be read out asynchronously. However, the next system illustrated is more appropriate if many ports are used for this read-out only and the same data is taken out at various delays only.

With this system, the data transmission for the memory cell array on the write-in side is parallel, and cross-transmission is used only on the read-out side. For this reason, small-scale circuit areas can be used.

Figure 6:
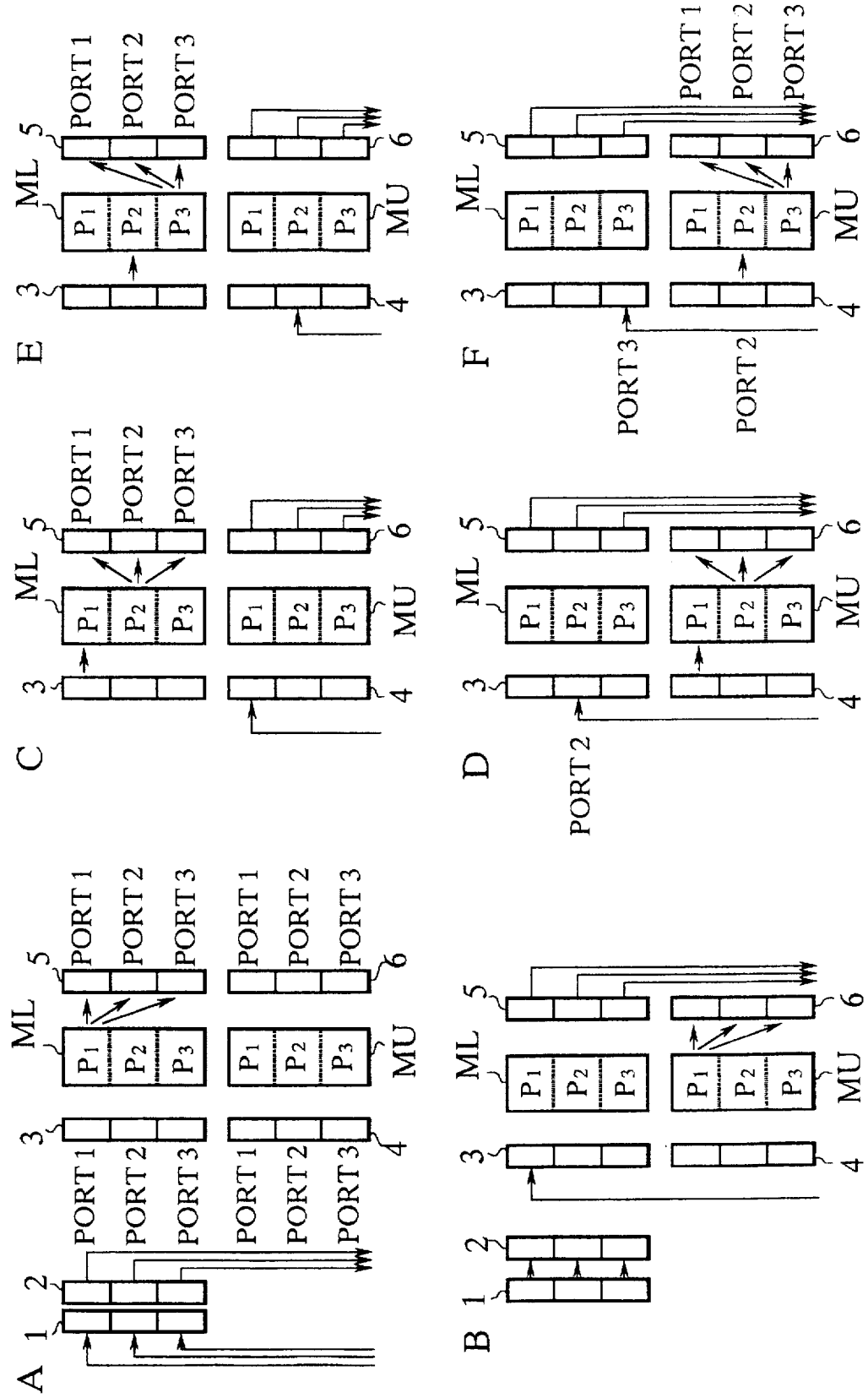
FIG. 6 is a diagram showing a sequence of operation in the case of cross-transmission for read-out only in the multiport field memory of the present invention (the gate transmission means are omitted).

FIG. 6 shows the sequence of data transmission when this type of system in which the cross-transmission is used only on the read-out side is used. The gate transmission means 100 are omitted from FIG. 6.

In this system, serial access proceeds in the sequence A, B, C, D, E, F, and the various steps show the states of serially accessing the line memories 1, 2, the write-in registers 3, 4, and the read-out registers 5, 6, respectively. In addition, the write-in and read-out are indicated as proceeding simultaneously in FIG. 6, but actually these are carried out independently and asynchronously.

This is also the same for each of the ports of the write-in registers and the read-out registers. Further, the line memories 1, 2 are omitted with the exception of those for A and B. Below, these are explained in sequence.

First, as shown in A of FIG. 6, during serial access to the line memories 1, 2, for write-in, the same data is transferred serially and simultaneously to the three ports in the line register 1. For read-out, the data in each port of the line register 2 is accessed asynchronously, in parallel.

During this write-in and read-out, for read out of the lower order memory cell array ML, the data for the same parts of the lower order memory cell array ML is transferred to each port of the read-out register 5, and preparation for the next read-out step is carried out.

This data of the same part in the lower order memory cell array ML can be transferred to the registers in the different ports (port1, port2, port3) by the transfer gate circuit having the configuration shown in FIG. 2.

Next, as shown in B of FIG. 6, when the write-in register 3 of the lower order address is accessed, the register corresponding to the port 1 in the write-in register 3 is accessed for write-in, and each port in the read-out register 5 are accessed asynchronously.

The write-in operation is changed to the write-in for the write-in register 3, and when the read-out is performed at this step, the data is transferred at a time from the line memory 1 to the line memory 2. For read-out, the data for the first part of the upper order memory cell array MU is transferred to each port of the read-out register 6, and preparation for the next read-out step is carried out.

Next, as shown in C of FIG. 6, when the write-in register 4 of the upper order address is accessed, for write-in, the part corresponding to the port 1 of write-in register 4 for the upper order address is accessed, and for read-out, data from the lower order memory cell array ML is transferred to each port of the read-out register 5 asynchronously.

For write-in to the memory cell array ML, during this operation above, data is transferred from the register of the port 1 to the first part of the lower order memory cell array ML, and this data is stored in the memory cell array ML.

For read-out to the read-out register 5, the data from the second part (P2) of the lower order cell array ML is transferred to each port (port1, port2, and port3) of the read-out register 5, and preparation for the next read-out step is carried out.

Next, as shown in D of FIG. 6, when the write-in register 3 of the lower order address is accessed, for write-in, the port 2 of the write-in register for write-in is accessed and each port (port1, port2, and port3) in the read-out register 5 of the upper order address are accessed asynchronously, in parallel.

For write-in, during the operation above, the data from the port 1 in the write-in register 4 is transferred to the first part (P1) of the upper order memory cell array MU to store it to a memory cell in the first part (P1) of the memory cell array MU.

For read-out, the data for the second part (P2) of the upper order cell array MU is transferred to each port (port1, port2, and port3) of the read-out register 6, and preparation for the next read-out step is carried out.

Next, as shown in E of FIG. 6, when the write-in register 4 of the upper order address is accessed, for write-in, the port 2 in the write-in register 4 for the upper order address is accessed, and for read-out, each port (port1, port2, and port3) in the read-out register 6 is accessed asynchronously, in parallel.

For write-in, the data from the register of the port 2 in the write-in register 3 is transferred to the second part of the lower order memory cell array ML to store this data to a memory cell in the part 2 of the memory cell array ML.

For read out, the data for the third part (P3) of the lower order memory cell array ML is transferred to each port (port1, port2, and port3) in the read-out register 5, and preparation for the next read-out step is carried out.

Next, as shown in F of FIG. 6, when the write-in register 3 of the lower order address is accessed, for write-in, the port 3 of the write-in register 3 for the lower order address is accessed, and for read-out, each port (port1, port2, and port3) in the read-out register 5 is accessed asynchronously, in parallel.

For write-in, during the operation above, the data from the port 2 of the write-in register 4 is transferred to the second part of the upper order memory cell array MU to store this data to a memory cell in the second part of the memory cell array MU.

For read-out, the data for the third part (P3) of the upper order cell array MU is transferred to each port (port1, port2, and port3) of the read-out register 6, and preparation for the next read-out step is carried out.

Thereafter, access and data transfer proceed in the same manner.

For convenience, the explanation of the above-mentioned system has been given for a write-in side with three ports (port1, port2, and port3). However, the serial access of the data is normally carried out through one port, and is essentially one port input.

Figure 7:
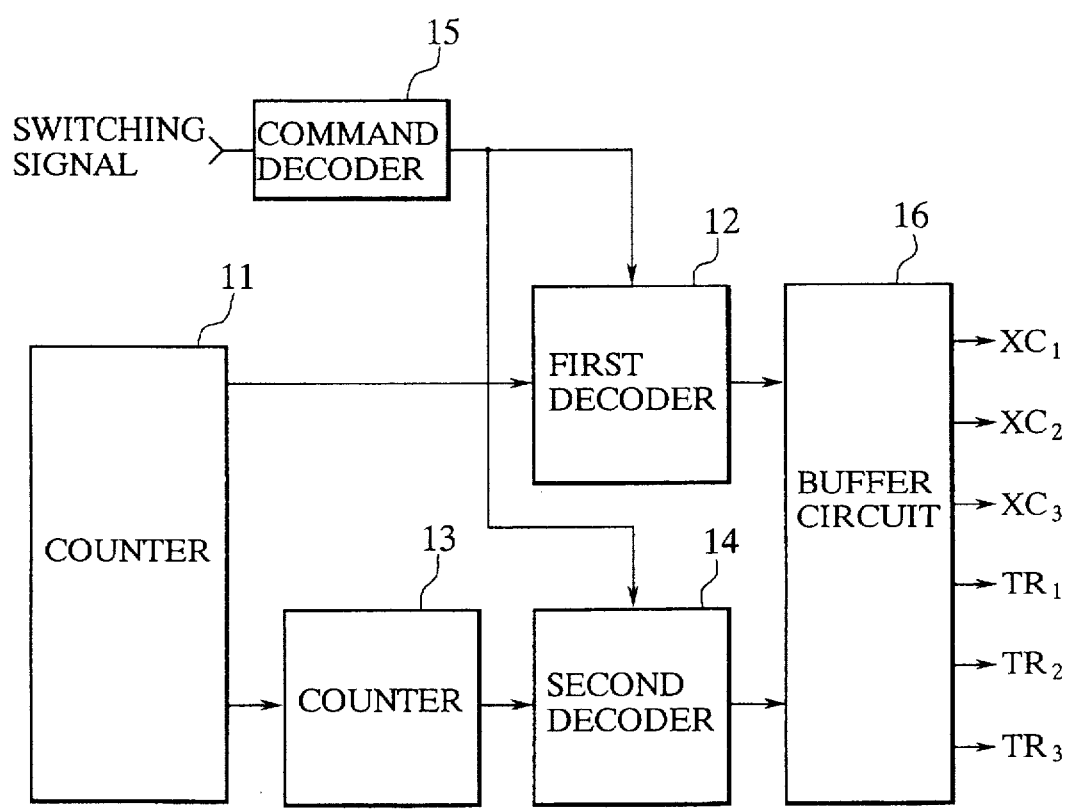
FIG. 7 shows an embodiment of a circuit for generating first and second gate drive control signals for the transfer gates shown in FIG. 2.

The transfer gate drive signals XC1, XC2, XC3, TR1, TR2, TR3, which control the operations of the transfer gates G11, G12, G13, G21, G22, G23 shown in FIG. 2, are, for example, generated in the circuit, as shown in FIG. 7.

In order to control the operations of these transfer gates, this signal generating circuit shown in FIG. 7 comprises a counter 11 for counting the number of the transferred data of the respective groups of the write-in registers 3, 4 and the read-out registers 5, 6, a first decoder 12 for decoding the output from the counter 11 and transferring a transfer gate drive signal used for a normal transmission mode wherein the cross-transmission is not carried out, a counter counting the tra the output of the counter 11 and counting the transfer data output of three write-in registers 3, 4 or of three read-out registers 5, 6, a second decoder 14 for decoding the output of the counter 13 and transferring a transfer gate drive signal used for the cross-transmission mode when carrying out cross-transmission, a command decoder 15 for switching the first decoder 12 and the second decoder 14, and a buffer circuit 16 for buffering and transferring the transfer gate drive signal of the first or second decoders 12, 14.

The present invention is not limited to the above-described embodiments. Either the write-in registers or the read-out registers can be grouped and accessed serially, independently, and asynchronously. It is also acceptable for either the write-in side or the read-out side only to be provided with a configuration which effectuates the cross-transmission as shown in FIG. 2.

As explained above in detail, using the present invention, when there is an equal number of input ports and output ports, by using time-sharing, it is possible to provide a substantial memory capacity merely by increasing the number of ports. Even when the input side is simplified so that there is one input port, the serially-input data can be taken out asynchronously with various delays.

Therefore, in the process of accumulation of data in time used for graphic data and acoustic data and the like, it is possible to provide an optimum multiport field memory for receiving and transferring data serially through a plurality of input and output ports.

In the present invention, a plurality of ports are incorporated for write-in and read-out of data for a FIFO type serial access memory. It is possible to store data in any particular memory cell from any of these ports. It is also possible to read out data from the same cell from any of these ports. In addition, data input to a memory cell through any one port can also be read out from that memory cell asynchronously from a plurality of ports.

While the above provides a full and complete disclosure of the preferred embodiments of the present invention, various modifications, alternate constructions and equivalents any be employed without departing from the true spirit and scope of the invention. Therefore the above description and illustration should not be construed as limiting the scope of the invention, which is defined by the appended claims.

What is claimed is:

1. A multiport field memory comprising:
    a cell array having memory cells arranged in rows and columns;
    a plurality of bit line pairs for transferring data from and to said memory cells;
    gate transmission means connected to said plurality of bit line pairs, said gate transmission means including
        a plurality of data line pairs, each data line pair having a first data line and a second data line, the first data lines of the plurality of data line pairs being directly connected together, and the second data lines of the plurality of data line pairs being diredtly connected together;
        a plurality of first transfer gate pairs, each first transfer gate pair being connected between one of the bit line pairs and one of the data line pairs; and a plurality of second transfer gate pairs, each second transfer gate pair being connected to one of the data line pairs;

a plurality of ports, each port including register means for storing data, and each port being connected to one of the second transfer gate pairs; and data cross-transmission control means including first gate control means for transferring first gate drive control signals to the first transfer gate pairs in order to activate one of the first transfer gate pairs to couple the corresponding bit line pair to all of the data line pairs; and second gate control means for transferring second gate drive control signals to the second transfer gate pairs in order to activate at least one of the second transfer gate pairs to couple the data line pairs connected to the activated second transfer gate pairs to said register means in the ports also connected to the activated second transfer gate pairs, wherein said data cross-transmission control means operates to allow data to be transferred from any one of the bit line pairs through the corresponding first transfer gate pair and through any of the second transfer gate pairs to any of the ports.

2. A multiport field memory as claimed in claim 1, further comprising:

a plurality of cell array groups defined by dividing said cell array;

a write-in register array including a plurality of write-in registers, each write-in register coupled to a port corresponding to a respective one of said plurality of cell array groups, each write-in register for storing independently, asynchronously, and serially transferred data, and for transferring said data at a time into one of said plurality cell array groups foming each row of said cell array; and a read-out register array including a plurality of read-out registers, each read-out register coupled to a port corresponding to a respective one of said plurality of cell array groups, each read-out register for storing data transferred at a time from any respective one of said cell array groups forming each row of said cell array, and for transferring said data independently, asynchronously, and serially from said respective one of plurality of cell array groups, wherein a first gate transmission means is incorporated between said write-in register array and said cell array, and a second gate transmission means is incorporated between said cell array, and said read-out register array, and data is transferred from said write-in register array to said plurality of cell array groups, and from said plurality of cell array groups to said read-out register array.

3. A multiport field memory as claimed in claim 2, wherein a write-in transfer and a read-out transfer are performed for one memory cell through a first write-in register in said write-in register array and a first read-out register in said read-out register array, and then another write-in transfer and another read-out transfer are performed for the same memory cell through a second write-in register in said write-in register array and a second read-out register in said read-out register array.

4. A multiport field memory as claimed in claim 1, further comprising:

a plurality of cell array groups defined by dividing said cell array;

a write-in register array including a plurality of write-in registers, each write-in register coupled to a port corresponding to a respective one of said plurality cell array groups, each write-in register for sequentially storing serially transferred data, and for transferring said data at a time into said respecrive one of said plurality of cell array groups which forms a row of said cell array; and a read-out register array including a plurality of read-out registers, each read-out register coupled to a port corresponding to a respective one of said plurality of cell array groups, for storing said data transferred at a time from said respective one of said plurality of cell array groups which forms said row of said cell array, and for transferring this stored data from said respective one of said plurality of cell array groups independently, asynchronously, and serially, wherein said data cross-transmission control means incorporated between said read-out register array and said cell array cross-transmits data between said read-out register array and said plurality of cell array groups.

5. A multiport field memory as claimed in claim 4, wherein each read-out register in said read-out register array corresponding to each of the plurality of cell array groups store data from a respective memory cell in said plurality of cell array groups and is accessed serially, and independent and asynchronous of the operation of said write-in register array.

6. A multiport field memory as claimed in claim 1, further comprising:

a plurality of cell array groups defined by dividing said cell array;

a write-in register array for transferring stored data into one of said plurality of cell array groups which forms a row of said cell array;

a read-out register array including a plurality of read-out registers, each rear-out register coupled to a plurality of ports corresponding to a respective one of said plurality of cell array groups, each read-out register for storing data serially, for storing said data transferred at a time from one of said plurality of cell array groups forming said row of said cell array, and for transferring the stored data from said respective one of said plurality of cell array groups independently, asynchronously, and serially, wherein said data cross-transmission control means incorporated between said read-out register array and said cell array cross-transmits data between said read-out register array and said plurality of cell array groups.

7. A multiport field memory as claimed in claim 1, further comprising:

a plurality of cell array groups defined by dividing said cell array:

a write-in register array including a plurality of write-in registers, each write-in register coupled to a port corresponding to a respective one of said plurality of cell array groups, each write-in register for storing independently, asynchronously and serially transferred data, and for transferring said data into one of said plurality of cell array groups which forms a row of said cell array; and a read-out register for storing data transferred at a time from one of said plurality of cell array groups which forms a row of said cell array, and for transferring this stored data serially, wherein said data cross-transmission control means incorporated between said write-in register array and said cell array cross-transmits data between said write-in register array and said plurality of cell array groups.

8. A multiport field memory comprising:

a cell array having memory cells arranged in rows and columns;

a plurality of bit line pairs for transferring data from and to the memory cells;

gate transmission means connected to the plurality of bit line pairs, said gate transmission means including a plurality of data line pairs, each data line pair having a first data line and a second data line, the first data lines of the plurality of data line pairs being directly connected together, and the second data lines of the plurality of data line pairs being directly connected together;

a plurality of first transfer gate pairs, each first transfer gate pair being connected between one of the bit line pairs and one of the data line pairs; and a plurality of second transfer gate pairs, each second transfer gate pair being connected to one of the data line pairs;

a plurality of ports, each port including register means for storing data, and each port being connected to one of the second transfer gate pairs; and data cross-transmission control means including first gate control means for transferring first gate drive control signals to the first transfer gate pairs in order to activate at least one of the first transfer gate pairs to couple the bit line pairs connected to the activated first transfer gate pairs to the data line pairs also connected to the activated first transfer gate pairs; and second gate control means for transferring second gate drive control signals to the second transfer gate pairs in order to activate one of the second transfer gate pairs to couple the register means in the port that is connected to the activated second transfer gate pair to all of the data line pairs, wherein the data cross-transmission control means operates to allow data to be transferred from any one of the ports through the corresponding second transfer gate pair and through any of the first transfer gate pairs to any of the bit line pairs.

\* \* \* \* \*